(12) United States Patent
Zimmer (10) Patent No.: US 9,244,134 B2
(45) Date of Patent: Jan. 26, 2016

(54) XMR-SENSOR AND METHOD FOR MANUFACTURING THE XMR-SENSOR

(71) Applicant: Infineon Technologies AG, Neubiberg (DE)

(72) Inventor: Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 338 days.

(21) Appl. No.: 13/741,693

(22) Filed: Jan. 15, 2013

(65) Prior Publication Data

US 2014/0197827 A1    Jul. 17, 2014

(51) Int. Cl.
  *G01R 33/02* (2006.01)
  *G01R 33/09* (2006.01)
  *H05K 3/30* (2006.01)
  *G01R 33/00* (2006.01)

(52) U.S. Cl.
  CPC ............ *G01R 33/09* (2013.01); *G01R 33/0052* (2013.01); *H05K 3/30* (2013.01); *Y10T 29/4913* (2015.01)

(58) Field of Classification Search
  CPC .... G01R 33/093; G01R 33/098; G01R 33/09; G01R 33/091; G11B 5/3903; G11B 5/3906; G11B 5/39; G11B 5/398; G11B 2005/0016; H01F 41/32; H01L 43/08; H01L 43/12; B82Y 25/00
  USPC ........ 324/7.21, 228, 232, 244, 249, 252, 301; 360/110–112, 313–316, 327.1–327.11, 360/322, 324.11–324.12, 325, 327.22, 360/119.1, 123.28; 365/158; 338/32 R
  See application file for complete search history.

(56) References Cited

U.S. PATENT DOCUMENTS

| 5,247,278 | A | * | 9/1993 | Pant et al. ................... 338/32 R |
| 5,898,546 | A | * | 4/1999 | Kanai ..................... B82Y 10/00 360/324.1 |
| 5,898,548 | A | * | 4/1999 | Dill et al. .................... 360/324.2 |
| 5,978,182 | A | * | 11/1999 | Kanai et al. ................. 360/324.1 |
| 5,991,125 | A | * | 11/1999 | Iwasaki et al. ........... 360/324.12 |
| 6,054,226 | A | * | 4/2000 | Takeda et al. ................. 428/682 |
| 6,157,525 | A | * | 12/2000 | Iwasaki et al. ........... 360/324.12 |
| 6,166,539 | A | * | 12/2000 | Dahlberg et al. .............. 324/252 |
| 6,252,749 | B1 | * | 6/2001 | Hayakawa ..................... 360/320 |
| 6,529,114 | B1 | * | 3/2003 | Bohlinger et al. .......... 338/32 R |
| 6,545,462 | B2 | * | 4/2003 | Schott ..................... G01D 5/145 324/207.2 |
| 6,721,141 | B1 | * | 4/2004 | Attenborough et al. ...... 360/324 |
| 6,831,817 | B2 | * | 12/2004 | Hasegawa et al. ........ 360/324.12 |
| 6,867,952 | B2 | * | 3/2005 | Hasegawa ................ 360/324.12 |
| 6,943,041 | B2 | * | 9/2005 | Sugita .................... B82Y 10/00 257/E27.005 |

(Continued)

FOREIGN PATENT DOCUMENTS

DE    WO 2006136577 A1 * 12/2006 ........... G01R 15/205

*Primary Examiner* — Patrick Assouad
*Assistant Examiner* — Sean Curtis
(74) *Attorney, Agent, or Firm* — Eschweiler & Associates, LLC (57) ABSTRACT

An XMR-sensor and method for manufacturing the XMR-Sensor are provided. The XMR-sensor includes a substrate, a first contact, a second contact and an XMR-structure. The substrate includes a first main surface area and a second main surface area. The first contact is arranged at the first main surface area and the second contact is arranged at the second main surface area. The XMR-structure extends from the first contact to the second contact such that an XMR-plane of the XMR-structure is arranged along a first direction perpendicular to the first main surface area or the second main surface area.

22 Claims, 10 Drawing Sheets

(56) References Cited

U.S. PATENT DOCUMENTS

| | | | |
|---|---|---|---|
| 6,961,222 B2* | 11/2005 | Kishi | 360/321 |
| 7,005,201 B2* | 2/2006 | Hasegawa et al. | 428/811.5 |
| 7,005,958 B2* | 2/2006 | Wan | 338/32 R |
| 7,038,448 B2* | 5/2006 | Schott | G01R 33/05 324/251 |
| 7,235,968 B2* | 6/2007 | Popovic | G01R 33/077 324/247 |
| 7,280,322 B2* | 10/2007 | Takahashi et al. | 360/324.1 |
| 7,323,870 B2* | 1/2008 | Tatschl | G01L 25/00 257/E27.005 |
| 7,532,436 B2* | 5/2009 | Hinoue et al. | 360/131 |
| 7,810,398 B2* | 10/2010 | Zimmer | B82Y 25/00 73/861.08 |
| 7,923,987 B2* | 4/2011 | Ausserlechner | G01D 5/145 324/126 |
| 8,150,657 B2* | 4/2012 | Yamashita | G01D 3/028 702/187 |
| 8,421,453 B2* | 4/2013 | Bauer | G01R 33/093 324/252 |
| 8,518,734 B2* | 8/2013 | Whig | B82Y 25/00 257/422 |
| 8,928,602 B1* | 1/2015 | Wan | 345/173 |
| 2002/0034055 A1* | 3/2002 | Seyama et al. | 360/324.11 |
| 2003/0184921 A1* | 10/2003 | Sugita et al. | 360/324.1 |
| 2004/0004261 A1* | 1/2004 | Takahashi et al. | 257/414 |
| 2004/0165319 A1* | 8/2004 | Wan et al. | 360/324.1 |
| 2006/0164080 A1* | 7/2006 | Popovic | G01R 33/06 324/244 |
| 2006/0176142 A1* | 8/2006 | Naito et al. | 338/32 R |
| 2007/0264422 A1* | 11/2007 | Zimmer | G01R 33/09 427/127 |
| 2008/0100289 A1* | 5/2008 | Zimmer et al. | 324/252 |
| 2008/0272771 A1* | 11/2008 | Guo et al. | 324/260 |
| 2008/0316654 A1* | 12/2008 | Aiso | 360/324 |
| 2009/0015252 A1* | 1/2009 | Raberg | B82Y 25/00 324/252 |
| 2009/0027048 A1* | 1/2009 | Sato et al. | 324/247 |
| 2009/0128282 A1* | 5/2009 | Zimmer | B82Y 25/00 338/32 R |
| 2009/0153138 A1* | 6/2009 | Theuss | B82Y 25/00 324/251 |
| 2009/0190264 A1* | 7/2009 | Fukuzawa et al. | 360/246.4 |
| 2009/0309590 A1* | 12/2009 | Kataoka | G01R 33/0011 324/244 |
| 2011/0074406 A1* | 3/2011 | Mather et al. | 324/252 |
| 2011/0244599 A1* | 10/2011 | Whig et al. | 438/3 |
| 2012/0074511 A1* | 3/2012 | Takahashi et al. | 257/427 |
| 2012/0153947 A1* | 6/2012 | Ausserlechner | G01D 5/145 324/252 |
| 2012/0193736 A1* | 8/2012 | Mather | G01R 33/098 257/421 |
| 2012/0212217 A1* | 8/2012 | Engel et al. | 324/252 |
| 2012/0262152 A1* | 10/2012 | Ausserlechner | G01R 33/072 324/117 R |
| 2013/0176022 A1* | 7/2013 | Lee | G01R 33/096 324/252 |
| 2013/0214776 A1* | 8/2013 | Holman et al. | 324/252 |
| 2013/0229175 A1* | 9/2013 | Wang et al. | 324/252 |
| 2013/0241543 A1* | 9/2013 | Stenson | G01R 33/096 324/252 |
| 2013/0299930 A1* | 11/2013 | Paci | B82Y 25/00 257/422 |
| 2014/0015524 A1* | 1/2014 | Lorenz | G01R 33/09 324/252 |
| 2014/0028307 A1* | 1/2014 | Ausserlechner | G01R 33/096 324/252 |

* cited by examiner

XMR-SENSOR AND METHOD FOR MANUFACTURING THE XMR-SENSOR

FIELD

Embodiments relate to an XMR-sensor. Further embodiments relate to a method for manufacturing an XMR-sensor. Further embodiments relate to a bridge circuit comprising four XMR-sensors. Some embodiments relate to an integration concept for a vertical AMR sensor.

BACKGROUND

Magnetic field sensors are used for a variety of applications. Many applications require the measurement of all three components of a magnetic field, e.g., compass applications. For two dimensional measurements the XMR-technology is very suitable due to the sensitivity to in-plane fields (e.g., along the x-axis and the y-axis), but fields perpendicular to the XMR-plane (e.g., along the z-axis) cannot be detected without further measures.

SUMMARY

An XMR-sensor is provided. The XMR-sensor comprises a substrate, an XMR-structure, a first contact and a second contact. The XMR-structure comprises at least one section which extends along a first direction perpendicular to the first main surface area or second main surface area such that an XMR-plane of the XMR-structure is arranged in the first direction. The first and second contacts are arranged to contact the at least one section of the XMR-structure at different locations.

An XMR-sensor is provided. The XMR-sensor comprises a substrate, a first contact, a second contact and an XMR-structure. The substrate comprises a first main surface area and a second main surface area. The first contact is arranged at the first main surface area and the second contact is arranged at the second main surface area. The XMR-structure extends from the first contact to the second contact such that an XMR-plane of the XMR-structure is arranged along a first direction perpendicular to the first main surface area or the second main surface area.

A method for manufacturing an XMR-sensor is provided. The method comprises providing a substrate having a first main surface area and a second main surface area. The method comprises providing an XMR-structure comprising at least one section which extends along a first direction perpendicular to the first main surface area or the second main surface area such that an XMR-plane of the XMR-structure is arranged in the first direction. The method comprises providing a first and second contact arranged to contact the at least one section of the XMR-structure at different locations.

A bridge circuit comprising a first bridge section and a second bridge section is provided. The first bridge section comprises a series connection of a first XMR-sensor and a second XMR-sensor. The second bridge section comprises a series connection of a third XMR-sensor and a fourth XMR-sensor. Each of the first, second, third and fourth XMR-sensors comprises a substrate area, a first contact, a second contact and an XMR-structure. The substrate comprises a first main surface area and a second main surface area. The XMR-structure comprises at least one section which extends along a first direction perpendicular to the first main surface area or the second main surface area, such that an XMR-plane of the XMR-structure is arranged in the first direction and in a second direction perpendicular to the first direction. The first and second contacts are arranged to contact the at least one section of the XMR-structure at different locations.

BRIEF DESCRIPTION OF THE DRAWINGS

Embodiments of the present disclosure are described herein making reference to the appended drawings.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

In the drawings, a Cartesian coordinate system comprising a first axis, a second axis and a third axis (substantially) perpendicular to each other is shown for illustration purposes.

Moreover, subsequently, a first direction describes a direction parallel to or along the first axis of the Cartesian coordinate system, wherein a second direction describes a direction parallel to or along the second axis of the Cartesian coordinate system, and wherein a third direction describes a direction parallel to or along the third axis of the Cartesian coordinate system.

The first axis of the Cartesian coordinate system can be denoted as the z-axis, wherein the second axis of the Cartesian coordinate system can be denoted as the y-axis, and wherein the third axis of the Cartesian coordinate system can be denoted as the x-axis. Moreover, the first direction can be denoted as the z-direction, wherein the second direction can be denoted as the y-direction, and wherein the third direction can be denoted as the x-direction.

Figure 1A:
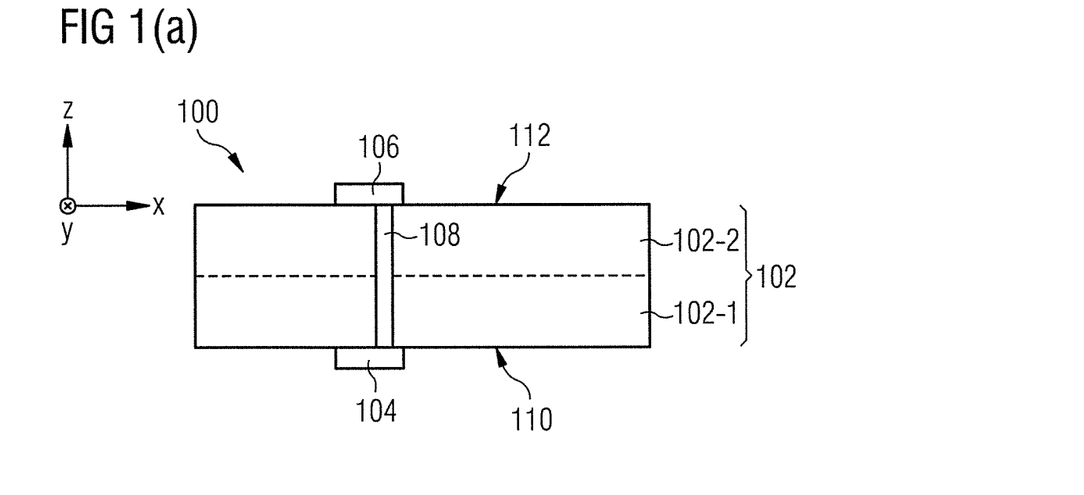
FIG. 1(a) shows a cross-sectional view of an XMR-sensor according to an embodiment.

FIG. 1(a) shows a cross-sectional view of an XMR-sensor 100 according to an embodiment. The XMR-sensor 100 comprises a substrate 102, a first contact 104, a second contact 106 and an XMR-structure 108. The substrate 102 comprises a first main surface area 110 and a second main surface area 112. The XMR-structure 108 comprises at least one section that extends along the first direction perpendicular to the first main surface area 110 and/or the second main surface area 112 such that an XMR-plane of the XMR-structure 108 is arranged in the first direction. The first contact 104 and the second contact 106 can be arranged to contact the at least one section of the XMR-structure 108 at different locations.

In embodiments, the XMR-structure 108 is arranged such that the XMR-plane, i.e., the active or sensitive area of the XMR-sensor 100, is arranged perpendicular to the first main surface area 110 and/or the second main surface area 112. Thus, the XMR-sensor 100 is sensitive to magnetic fields or magnetic field components perpendicular to the first main surface area 110 and/or the second main surface area 112.

As shown in FIG. 1(a), the first contact 104 and the second contact 106 can be arranged to contact the at least one section of the XMR-structure at different locations, e.g., a first location and a second location different from the first location, along the first direction.

For example, the first contact 104 can be arranged at the first main surface area 110, wherein the second contact 106 can be arranged at the second main surface area 112. The XMR-structure 108 can extend from the first contact 104 to the second contact 106 such that the XMR-plane of the XMR-structure 108 is arranged along the first direction perpendicular to the first main surface area 110 and/or the second main surface area 112.

In some embodiments, the first main surface area 110 can span a plane along the second direction (e.g., y-direction) and the third direction (e.g., x-direction), perpendicular to the first direction (e.g., z-direction).

Similarly, the second main surface area 112 can span a plane parallel to the second direction (e.g., y-direction) and the third direction (e.g., x-direction), perpendicular to the first direction (e.g., z-direction).

In other words, the idea is to tune the sensitive plane of the XMR-sensor 100 parallel to the first axis (e.g., z-axis) in order to obtain, in a direct way, a sensitivity along the first axis (e.g., z-axis).

Thereby, the XMR-structure 108 can be an AMR-structure (AMR=Anisotropic Magneto Resistive), a GMR-structure (GMR=Giant Magneto Resistive), a TMR-structure (TMR=Tunnel Magneto Resistive), or a CMR-structure (CMR=Colossal Magneto Resistive) or an EMR-structure (EMR=Extraordinary Magneto Resistive). Thus, XMR may refer to AMR, GMR, TMR, CMR or EMR.

Note that a possible integration concept is explained in some embodiments by means of an AMR-sensor, since its essential component is only one permalloy layer, e.g., NiFe, of a certain thickness (e.g., 10 to 50 nm, or 5 to 70 nm, or 20 to 40 nm). In other words, in some embodiments, a way how to implement an AMR-technology sensitive to magnetic fields perpendicular to the substrate plane (or first main surface area 110 and/or second main surface area 112) is described.

As indicated in FIG. 1(a), the substrate 102 can comprise at least two substrate layers $102\_1$ to $102\_n$ (n≥2) stacked in the first direction. The first contact 104 can be arranged in or at a first substrate layer $102\_1$ of the at least two substrate layers $102\_1$ to $102\_n$ (n≥2), and wherein the second contact 106 can be arranged in or at a second substrate layer $102\_2$ of the at least two substrate layers $102\_1$ to $102\_n$ (n≥2).

Note that the substrate 102 can comprise up to n substrate layers $102\_1$ to $102\_n$, wherein n is a natural number equal to or greater than 2 (n≥2). For example, as shown in FIG. 1a, the substrate can comprise a first substrate layer $102\_1$ and a second substrate layer $102\_2$. Naturally, the substrate can also comprise further substrate layers $102\_3$ to $102\_n$, e.g., a third substrate layer $102\_3$ and a fourth substrate layer $102\_4$ arranged between the first substrate layer $102\_1$ and the second substrate layer $102\_2$.

At least the first substrate layer $102\_1$ and the second substrate layer $102\_2$ of the at least two substrate layers $102\_1$ to $102\_n$ (n≥2) can comprise a dielectric material. For example, the first substrate layer $102\_1$ and the second substrate layer $102\_2$ can comprise oxide or nitride.

Figure 1B:
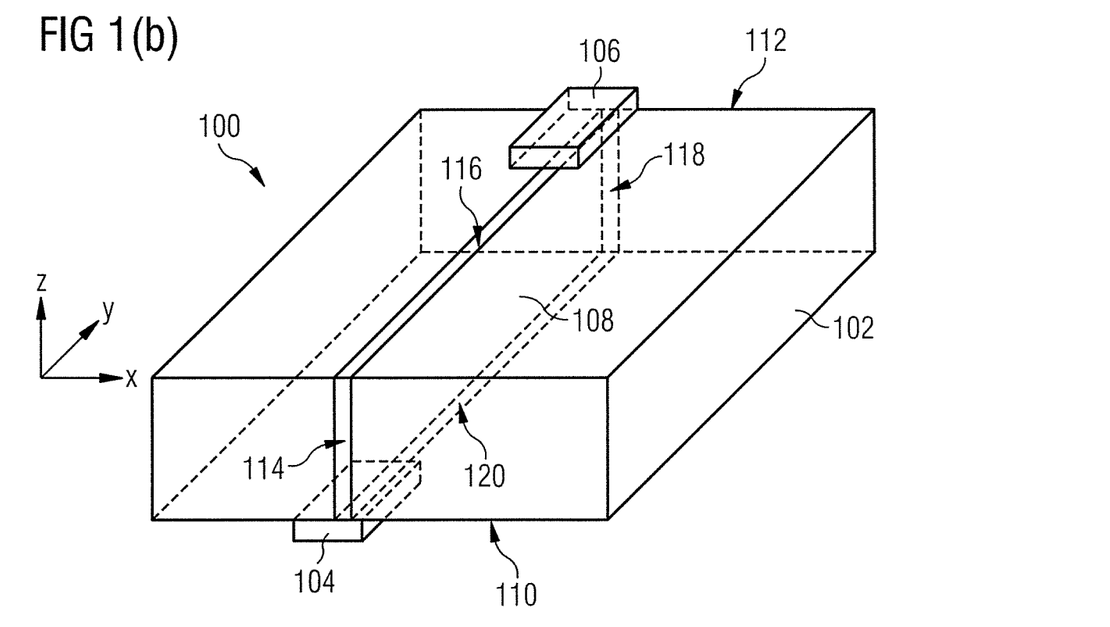
FIG. 1(b) shows a perspective view of the XMR-sensor according to an embodiment.

FIG. 1(b) shows a three-dimensional view of the XMR-sensor 100.

As indicated in FIG. 1b, the first contact 104 and the second contact 106 can be arranged at different positions along the second direction (e.g., y-direction) perpendicular to the first direction (e.g., z-direction).

The XMR-structure 108 may extend from the first contact 104 to the second contact 106 such that the XMR-plane of the XMR-structure is arranged along the first direction (e.g., z-direction) and the second direction (e.g., y-direction) perpendicular to the first direction (e.g., z-direction).

Further, the XMR-structure 108 may extend from the first contact 104 to the second contact 106 such that a first edge 114 of the XMR-structure 108 is arranged along the first direction (e.g., z-direction) and a second edge 116 of the XMR-structure 108 is arranged along the second direction (e.g., y-direction) perpendicular to the first direction (e.g., z-direction).

Naturally, also a third edge 118 of the XMR-structure 108 can be arranged along the first direction (e.g., z-direction), wherein a fourth edge 120 of the XMR-structure 108 can be arranged along the second direction (e.g., y-direction).

The XMR-structure 108 with the four edges 114 to 120 can comprise a (substantially) rectangular or quadratic shape.

Thus, a current applied to the first contact 104 (or the second contact 106) may flow through the XMR-structure 108 to the second contact 106 (or first contact 104) at a certain angle with respect to the first main surface area 110 and/or the second main surface area 112. The certain angle can be in a range between 10° and 80°, between 20° and 70°, between 30° and 60°, or between 40° to 50°. A modification and optimization of the mean certain angle can be done by an adjustment of the ratio of the XMR structure height 140 and the distance of the first and second contact 142. Furthermore, also a vertical current direction parallel to the first direction of approximately 0° can be obtained.

As shown in FIG. 1(b), the first main surface area 110 and the second main surface area 112 can be parallel to each other and face each other.

Moreover, a dimension of the substrate 102 along the first direction (e.g., z-direction) can be smaller than a dimension of the substrate 102 along the second direction (e.g., y-direction) and/or a dimension of the substrate 102 along the third direction (e.g., x-direction), perpendicular to the first direction (e.g., z-direction).

Figure 1C:
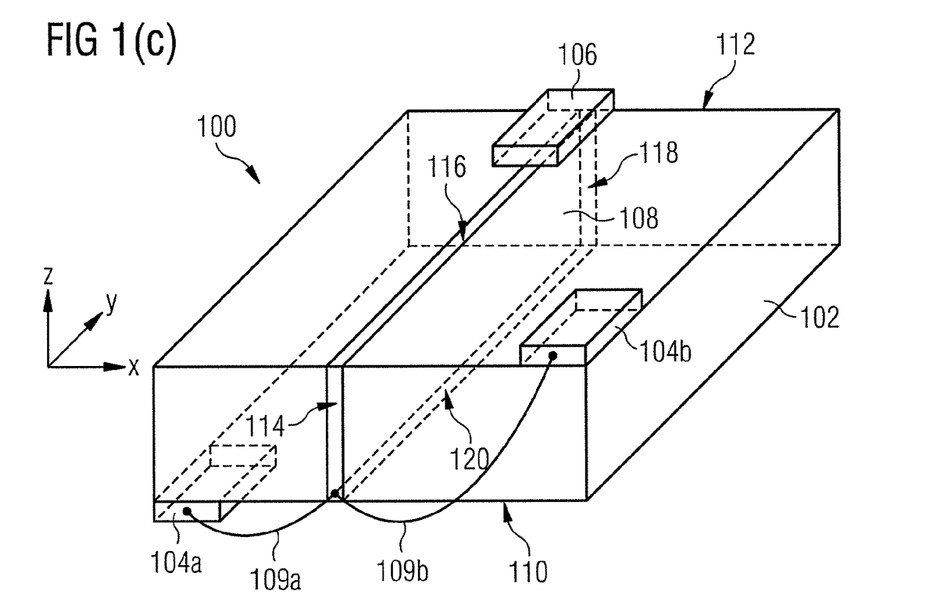
FIG. 1(c) shows a perspective view of the XMR-sensor according to a further embodiment.

FIG. 1(c) shows a three-dimensional view of the XMR-sensor 100 according to a further embodiment. In contrast to FIG. 1(b), in which the first contact 104 is arranged to contact the at least one section of the XMR-structure 108 directly, in FIG. 1(c) the first contact 104 is arranged to contact the at least one section of the XMR-structure 108 by means of a low impedance connection 109.

The low impedance connection 109 can be a connection having an impedance smaller than 10Ω, 1Ω, 0.1Ω, 0.01Ω, or 0.001Ω, such as a wire, a trace, or a combination of a via and a trace, for example.

Naturally, also the second contact 106 can be arranged to contact the at least one section of the XMR-structure 108 by means of a low impedance connection.

Note that the first contact 104 may contact the at least one section of the XMR-substrate 108 directly or by means of a low impedance connection at a first location, wherein the second contact 106 may contact the at least one section of the XMR-substrate 108 directly or by means of a low impedance connection at a second location different from the first location (along the first direction). As indicated in FIGS. 1(a) to 1(c), a distance between the first location and the second location along the first direction can be equal to a dimension of the XMR-structure 108 along the first direction. Naturally, the distance between the first location and the second location can also be smaller than the dimension of the XMR-structure 108 along the first direction.

Referring to FIG. 1(c), the first contact 104 can be arranged at the first main surface area 110, which is indicated with reference numeral 104a, and be connected to the at least one section of the XMR-structure 108 by means of the low impedance connection 109, which is indicated with reference numeral 109a.

Moreover, the first contact 104 can be arranged at the second main surface area 112, which is indicated with reference numeral 104b, and be connected to the at least one section of the XMR-structure 108 by means of the low impedance connection 109, which is indicated with reference numeral 109b.

In the following, a method for manufacturing the XMR-sensor 100 shown in FIG. 1(a) and/or FIG. 1(b) is described.

Figure 2:
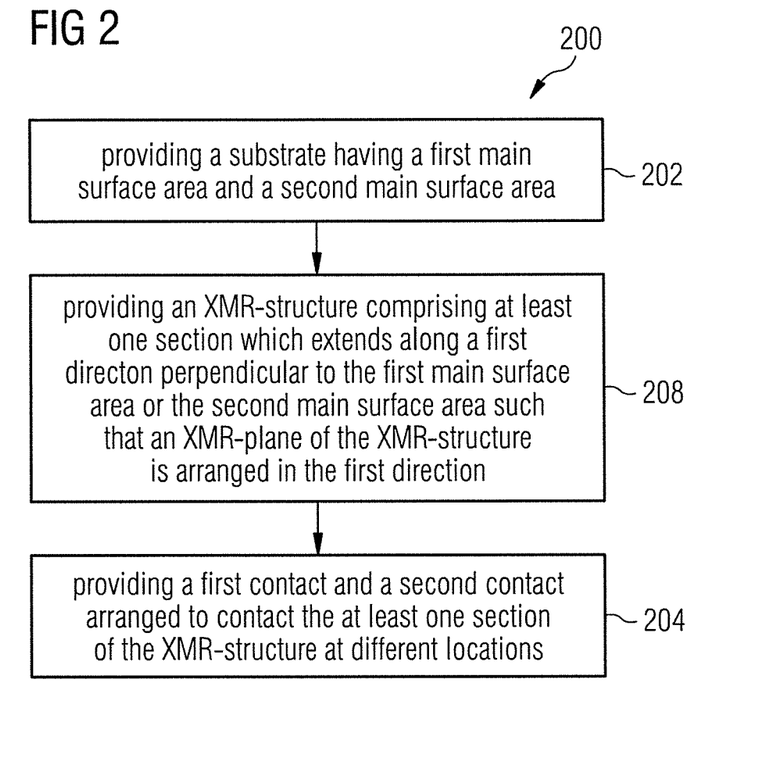
FIG. 2 shows a flow chart of a method for manufacturing the XMR-sensor.

FIG. 2 shows a flow chart of a method 200 for manufacturing the XMR-sensor 100. The method 200 comprises providing a substrate 102 having a first main surface area 110 and a second main surface area 112 at 202. The method 200 comprises providing an XMR-structure 108 that extends from the first contact 104 to the second contact 106 such that an XMR-plane of the XMR-structure 108 is arranged along a first direction perpendicular to the first main surface area 110 and/or the second main surface area 112 at 208. The method comprises providing a first contact 104 and a second contact 106 arranged to contact the at least one section of the XMR-structure 108 at different locations at 204.

Subsequently, the method 200 for manufacturing the XMR-sensor is described by way of example making reference to FIGS. 3(a) to 3(e) showing cross-sectional views of the XMR-sensor 100 during manufacturing.

Thereby, it is assumed that the first contact 104 is arranged at the first main surface area 110, wherein the second contact 106 is arranged at the second main surface area 112, and wherein the XMR-structure extends from the first contact 104 to the second contact 106 such that the XMR-plane of the XMR-structure 108 is arranged along the first direction perpendicular to the first main surface area 110 and/or the second main surface area 112.

Figure 3A:
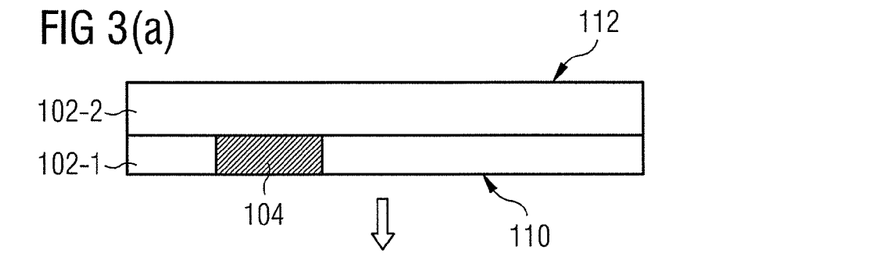
FIG. 3(a) shows a cross-sectional view of the XMR-sensor during manufacturing after providing the substrate having the first main surface area and the second main surface area.

FIG. 3(a) shows a cross-sectional view of the XMR-sensor 100 during manufacturing after providing 202 the substrate 102 having the first main surface area 110 and the second main surface area 112.

As indicated in FIG. 3(a), providing 202 the substrate 102 can comprise providing a first substrate layer 102_1 (dielectric 1, e.g., oxide) and providing a second substrate layer 102_2 (dielectric 2, e.g., oxide).

Providing the first contact 104 at 204 can comprise providing the first contact 104 such that the first contact is arranged in or at the first substrate layer 102_1.

Figure 3B:
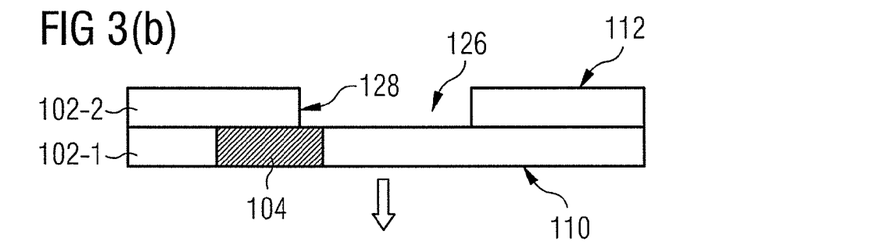
FIG. 3(b) shows a cross-sectional view of the XMR-sensor during manufacturing after etching the substrate.

FIG. 3(b) shows a cross-sectional view of the XMR-sensor 100 during manufacturing after etching the substrate 102.

Providing the XMR-structure 108 at 208 can comprise etching the substrate 102 from the second main surface area 112 against or opposite to the first direction at least until reaching the first contact 104 in order to obtain an etched structure 126 in which the first contact 104 is at least partly exposed.

The etched structure 126 can be arranged such that a first wall 128 of the etched structure 126 extends from the second main surface area 112 to the first contact 104.

In other words, FIG. 3(b) shows a cross-sectional view of the XMR-sensor 100 after a lithographic and dielectric 2 etch step.

Figure 3C:
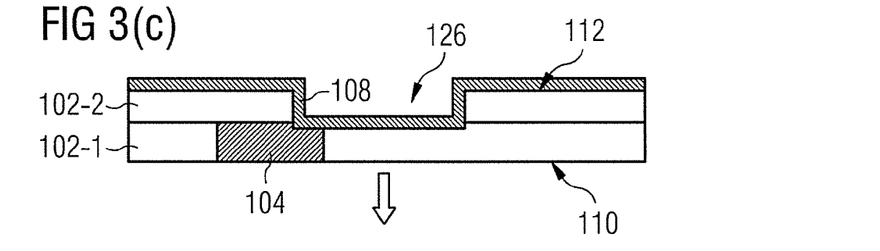
FIG. 3(c) shows a cross-sectional view of the XMR-sensor during manufacturing after depositing a ferromagnetic layer on the second main surface area and the etched structure.

FIG. 3(c) shows a cross-sectional view of the XMR-sensor 100 during manufacturing after depositing a ferromagnetic layer 108 on the second main surface area 112 and the etched structure 126.

Providing the XMR-structure 108 at 208 can comprise depositing a ferromagnetic layer (or XMR-layer) 108 on the second main surface area 112 and the etched structure 126 such that the ferromagnetic layer 108 rests on the etched structure 126 and such that at least a part of the ferromagnetic layer 108 extends from the second main surface area 112 to the first contact 104 along the edge 128.

Figure 3D:
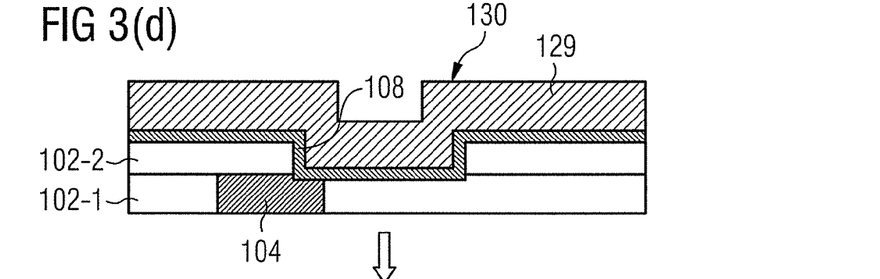
FIG. 3(d) shows a cross-sectional view of the XMR-sensor during manufacturing after depositing a dielectric layer on the ferromagnetic layer.

FIG. 3(d) shows a cross-sectional view of the XMR-sensor 100 during manufacturing after depositing a dielectric layer 129 on the ferromagnetic layer 108.

Providing 208 the XMR-structure 108 can further comprise depositing the dielectric layer 129 on the ferromagnetic layer 108.

Figure 3E:
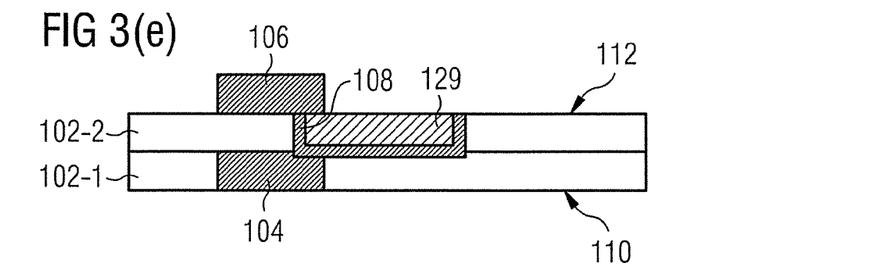
FIG. 3(e) shows a cross-sectional view of the XMR-sensor during manufacturing after chemical mechanical polishing the XMR-sensor and providing the second contact.

FIG. 3(e) shows a cross-sectional view of the XMR-sensor 100 during manufacturing after chemical mechanical polishing the XMR-sensor 100 and providing the second contact 106.

In other words, FIG. 3(e) shows a CMP process (CMP=Chemical Mechanical Polishing) and metal deposition/etch.

Providing the XMR-structure 108 at 208 can comprise chemical mechanical polishing the XMR-sensor 100 beginning from a surface 130 of the dielectric layer 129 until at least the second main surface area 112 of the substrate 102 and the part of the ferromagnetic layer 108 that extends from the second main surface area 112 to the first contact 104 is exposed.

The second contact 106 can be provided at the second main surface area 112 such that the part of the ferromagnetic layer 108 that extends from the second main surface area 112 to the first contact 104 forms the XMR-structure 108.

As shown in FIGS. 3(a) to 3(e), the method 200 allows the fabrication of grooves 126 having sidewalls 128 deposited with permalloy 108 of a defined thickness.

In other words, FIGS. 3(a) to 3(e) show a schematic of a possible process. After providing a second dielectric layer 102_2 on a wiring metal 104 with a thickness which will be approximately the height of the vertical AMR-layer (FIG. 3(a)), a groove 126 can be etched into the second dielectric layer 102_2 (FIG. 3(b)). Then, a deposition process with good edge coverage can be applied where the side and bottom walls of the groove 126 are covered with a highly permeable film which shows a significant AMR effect, e.g., permalloy Ni81Fe19 (FIG. 3(c)). Next, a dielectric film 129 (e.g., oxide) can be deposited (FIG. 3(d)) and polished together with the ferromagnetic material 108 outside the groove 126 (FIG. 3(e)). As a result, a flat surface 112 is obtained and the top side of the vertical AMR-layer 108 can be contacted, e.g., by a further metal 106.

Figure 8A:
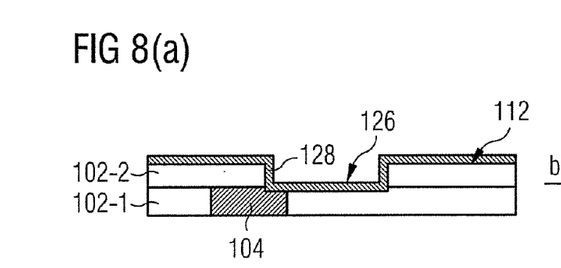
FIG. 8(a) shows a cross-sectional view of the XMR-sensor during manufacturing after depositing the ferromagnetic layer on the second main surface area and the etched structure.
Figure 8B:
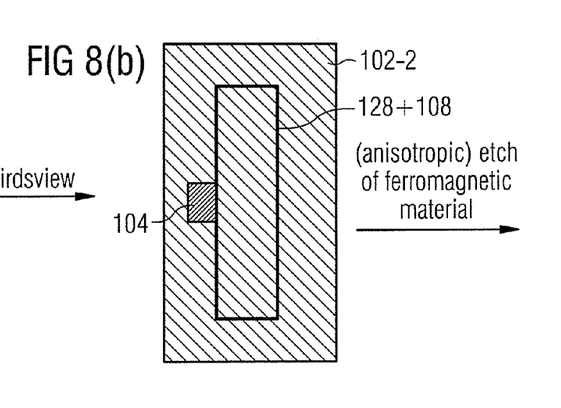
FIG. 8(b) shows a top view of the XMR-sensor during manufacturing after depositing the ferromagnetic layer on the second main surface area and the etched structure.
Figure 8C:
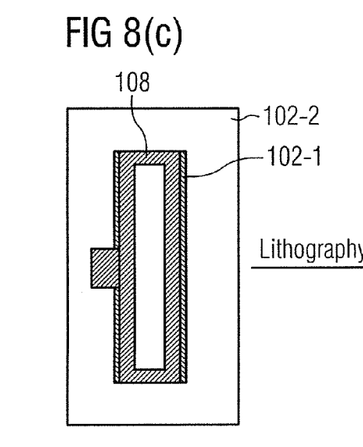
FIG. 8(c) shows a top view of the XMR-sensor during manufacturing after etching the ferromagnetic layer at the lower portion of the edged structure.
Figure 8D:
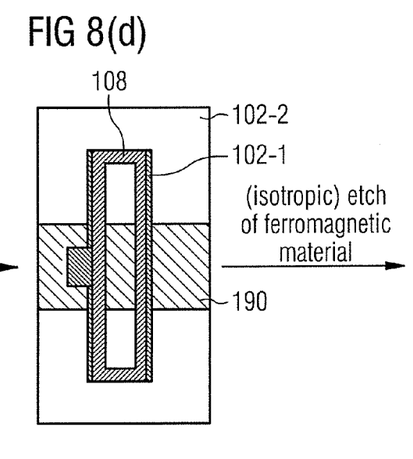
FIG. 8(d) shows a top view of the XMR-sensor during manufacturing after applying a lithographic mask.
Figure 8E:
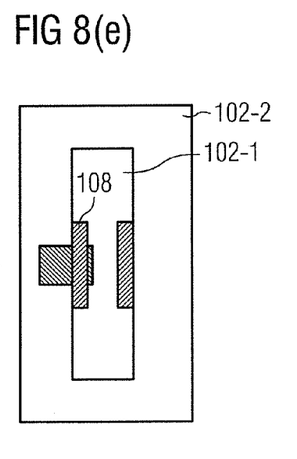
FIG. 8(e) shows a top view of the XMR-sensor during manufacturing after etching the XMR-layer.

According to a further embodiment, the manufacturing steps shown in FIGS. 3(d) and 3(e) can be exchanged by the manufacturing steps shown in FIGS. 8(c) to 8(e) as will become clear from the following description.

FIG. 8(a) shows a cross-sectional view of the XMR-sensor 100 during manufacturing after depositing the ferromagnetic layer 108 on the second main surface area 112 and the etched structure 126 as already shown in FIG. 3(c).

FIG. 8(b) shows a top view of the XMR-sensor 100 during manufacturing after depositing the ferromagnetic layer 108 on the second main surface area 112 and the etched structure 126.

FIG. 8(c) shows a top view of the XMR-sensor 100 during manufacturing after etching the ferromagnetic layer 108 at the lower portion of the edged structure 126.

Providing the XMR-structure 108 can comprise etching the XMR-layer 108 at the bottom of the etched structure 126 while maintaining the part of the XMR-layer 108 which extends from the second main surface area 112 to the first contact 104.

In other words, the step of providing the XMR-structure 108 can comprise removing the XMR-material 108 from the bottom plane of the etched structure 126 by an etch process.

For example, the XMR-material 108 can be removed from the bottom of the etched structure 126 with an (anisotropic) etch process.

FIG. 8(d) shows a top view of the XMR-sensor 100 during manufacturing after applying a lithographic mask 190.

Providing the XMR-structure 108 can comprise applying a lithographic mask 190 on a portion of the etched structure 126 such that the lithographic mask 190 rests on a portion of the XMR-layer 108, the portion of the XMR-layer 108 including the part of the XMR-layer 108 which extends from the second main surface area 112 to the first contact 104.

In other words, a lithography step can be applied where only a portion of the etched structure 126 is covered by a resist 190.

FIG. 8(e) shows a top view of the XMR-sensor 100 during manufacturing after etching the XMR-layer 108.

Providing the XMR-structure 108 can comprise etching a portion the XMR-layer 108 while maintaining the portion of the XMR-layer 108 on which the lithographic mask 190 rests.

In other words, providing the XMR-structure 108 can comprise a lithography step and a subsequent etch process step where all XMR material is removed such that the XMR material remains only in selected regions of the side walls of the etched structure For example, after an (isotropic) etch process only XMR material 108 beneath the resist remains at the side walls 128. As a result, the XMR sensor structure 108 exhibits two additional edges 114 and 118 (see FIG. 1(b)). The benefit is no electric and magnetic interference from other regions. Moreover, more than one XMR sensor structure 108 can be manufactured within one etched groove 126.

Alternatively, the removal of the XMR material from the bottom of the etched structure 126 can also be omitted.

In the following, the functionality of the XMR-sensor 100 is described by way of example making reference to FIGS. 4a to 6.

Figure 4A:
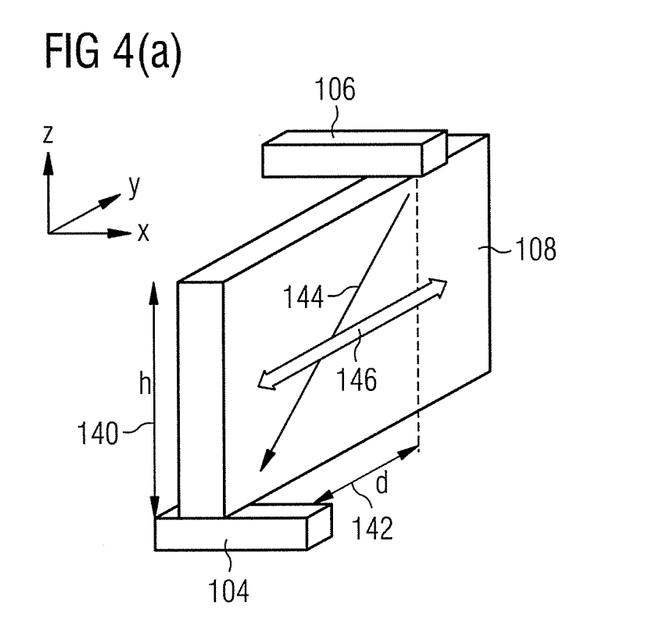
FIG. 4(a) shows a three-dimensional view of the first contact, the second contact and the XMR-structure which extends from the first contact to the second contact.

FIG. 4(a) shows a three-dimensional view of the first contact 104, the second contact 106 and the XMR-structure 108 which extends from the first contact 104 to the second contact 106.

The first contact 104 and the second contact 106 are arranged at different positions along the second direction (e.g., y-direction) perpendicular to the first direction (e.g., z-direction).

As shown in FIG. 4(a), a height 140 (h) of the XMR-structure 108 can be defined along the first direction (e.g., z-direction), wherein a distance 142 (d) between the first contact 104 and the second contact 106 can be defined along the second direction (e.g., y-direction).

As already mentioned, by arranging the first contact 104 and the second contact 106 at different positions along the second direction (e.g., y-direction), a current applied to the second contact 106 (or first contact 104) flows through the XMR-structure 108 to the first contact 104 (or second contact 106) at a certain angle with respect to the first main surface area 110 and/or the second main surface area 112. This current direction is indicated in FIG. 4(a) with the arrow 144 (net current direction).

Due to the shape of the XMR-structure, i.e., that the dimension of the XMR-structure 108 along the first direction (e.g., z-direction) is smaller than a dimension of the XMR-structure along the second direction (e.g., y-direction), the anisotropic axis 146 (easy axis) of the XMR-structure 108 is parallel to the first direction (e.g., y-direction).

In other words, FIG. 4(a) shows a schematic view of one side wall 128 of the groove 126 shown in FIG. 3 showing the top and bottom contact 104 and 106 to realize a net current direction 144 having an angle to the easy axis 146.

AMR-magnetic field strength sensors exhibit a predefined angle between the easy axis of the magnetization and the current direction of ~45° in order to shift the working point into a region of the magnetoresistance response with a linear and non-zero sensitivity ("barber poles" of AMR-sensors). For a detection of the z-axis magnetic field component, the easy axis 146 can be in the x-/y-plane, e.g., along the y-axis as shown in FIG. 4(a). To obtain a certain angle between the easy axis 146 and the net current direction 144, a top and bottom (punctual) contact 104 and 106 can be spaced apart by a distance 142 (d) which can be in the range of the wall height 140 (h).

Figure 4B:
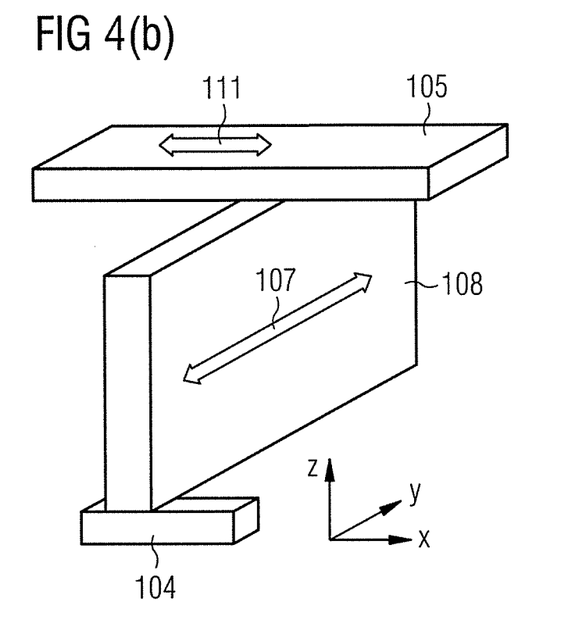
FIG. 4(b) shows a three-dimensional view of the XMR-sensor shown in FIG. 4(a) further comprising a current conductor 105 arranged at or parallel to the second main surface area.

FIG. 4(b) shows a three-dimensional view of the XMR-sensor 100 shown in FIG. 4(a) further comprising a current conductor 105. The current conductor 105 can be arranged at or parallel to the second main surface area 112 such that a current 111 flowing through the current conductor is perpendicular to the XMR-plane of the XMR-structure 108. The current 111 flowing through the current conductor 105 may generate a magnetic field parallel to the XMR-plane of the XMR-structure, e.g., parallel to the second direction (e.g., y-direction).

Figure 4C:
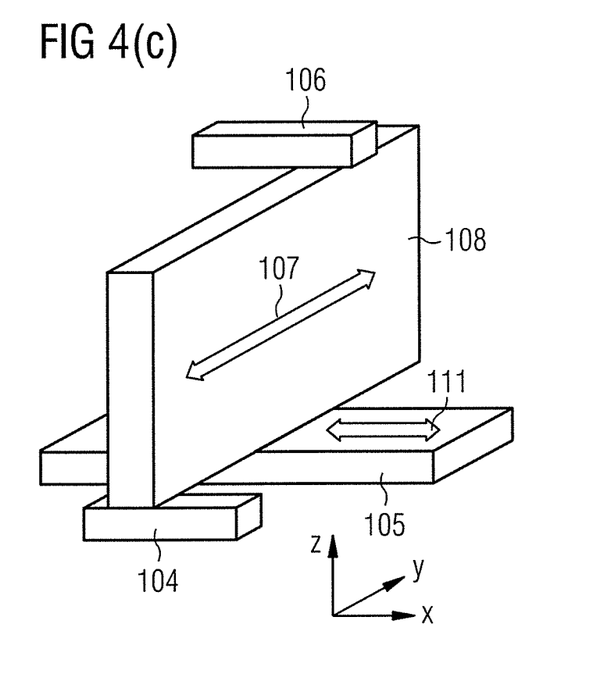
FIG. 4(c) shows a three-dimensional view of the XMR-sensor shown in FIG. 4(a) further comprising a current conductor 105 arranged at or parallel to the first main surface area.

FIG. 4(c) shows a three-dimensional view of the XMR-sensor 100 shown in FIG. 4(a) further comprising a current conductor 105. In contrast to FIG. 4(b), the current conductor 105 is arranged at or parallel to the first main surface area 110 but also such that a current 111 flowing through the current conductor is perpendicular to the XMR-plane of the XMR-structure 108.

In other words, a current conductor 105 providing a current flow 111 parallel to the first main surface 110 or second main surface 112 and perpendicular to the plane of the XMR-structure 108 can be provided as shown in FIG. 4(b). As a result, a magnetic field 107 is generated parallel to the second direction (and parallel to the anisotropy axis 146). The generated magnetic field 107 can be used to provide an initial magnetic field to obtain defined magnetic conditions within the XMR sensor 100 to enhance the measurement accuracy. Further, especially in case of an AMR sensor structure the additional magnetic field can lead to so called flipping of the sensor layer magnetization from one side of the anisotropy axis 146 to the other side and vice versa, depending on the applied current direction through the current conductor 105. From AMR magnetic field strength sensors based on a Wheatstone full bridge concept it is well known that flipping of the sensor layer magnetization along the anisotropy axis 146 allows an exact measurement of the bridge offset and therefore, an accurate offset compensation. This is advantageous to achieve a high measurement accuracy. The current conductor can be implemented above the XMR structure 108 with an insulating material in between as shown in FIG. 4(b). Alternatively, the current conductor 105 can already be implemented within the first substrate layer 102_1 as indicated in FIG. 4(c). In this case, the current conductor 105 will be beneath the XMR structure 108. Also a combination of a current conductor 105 above and below the XMR structure 108 for an enhancement of the achievable magnetic field is possible.

Figure 5:
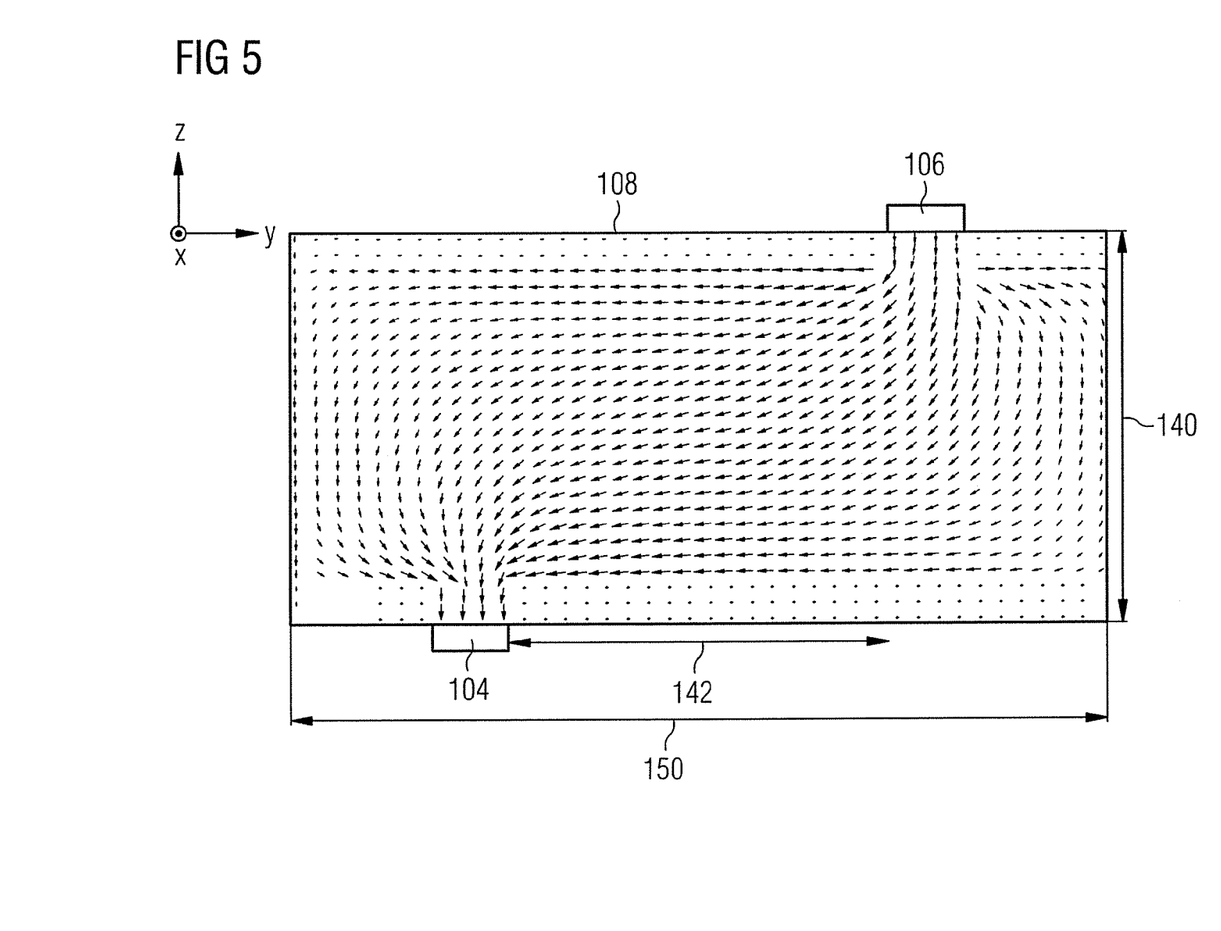
FIG. 5 shows an illustrative view of the current distribution within the XMR-structure shown in FIG. 4(a)

FIG. 5 shows an illustrative view of the current distribution within the XMR-structure 108 shown in FIG. 4(a).

As shown in FIG. 5, a current applied to the second contact 106 flows through the XMR-structure to the first contact 104.

In other words, FIG. 5 shows the simulated current direction distribution for the example in FIG. 4(a) with a wall height 140 of 2 μm, a length 150 of 5 μm and a top contact 106/bottom contact 104 displacement 142 of 2 μm.

A distinct angle variation of the current direction can be observed in the region with significant current density between approximately 25° and 65°. By combining the calculated current distribution with the simulated micro magnetic behavior, the simulated output signal upon an external y-component magnetic field can be obtained.

Figure 6:
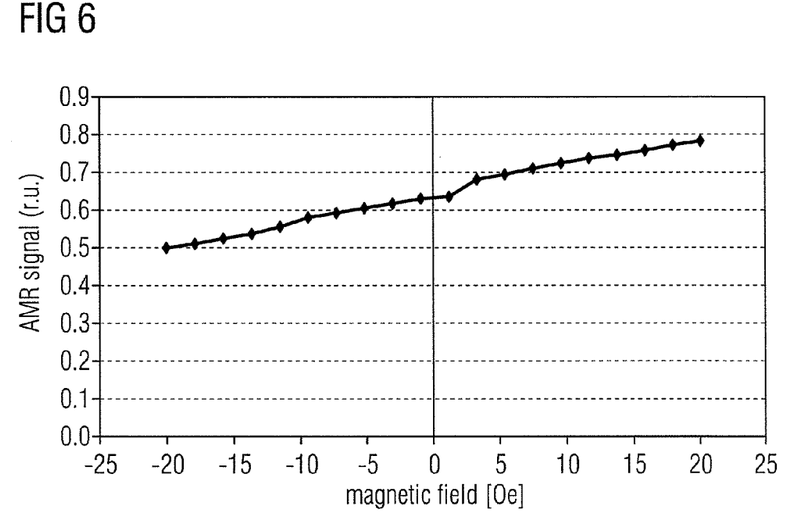
FIG. 6 shows in a diagram the simulated output signal based on a y-component of an external magnetic field.

FIG. 6 shows in a diagram the simulated output signal based on the external y-component magnetic field.

Thereby, the ordinate describes the output signal (AMR-signal) in relative units, wherein the abscissa describes the magnetic field in oersted.

In other words, FIG. 6 shows the resulting AMR-signal taking into account the micro magnetic and electric behavior of a 5 μm long and 2 μm high permalloy side wall.

As shown in FIG. 6, the originally bell-shaped AMR-characteristic is transferred to a linear behavior which can be used to measure the field strength. A mirroring of the positions of the top and bottom contact 104 and 106 leads to a rotation of the net current direction by ~90°. As a consequence, the output characteristic of FIG. 6 is also mirrored. This is a prerequisite to realize a differential Wheatstone bridge configuration.

As described above, some embodiments provide a vertical AMR-active layer 108 having a magnetic field sensitivity perpendicular to the chip plane (z-axis) 110 or 112. The AMR-active layer 108 exhibits an easy axis 146 perpendicular the z-axis and a defined angle (direction distribution) between the sensor current and the easy axis 146.

Thereby, the XMR-sensor 100 provides the advantage of no hysteresis effects due to flux concentrator materials as they are widely used for other state-of-the-art technologies to realize a transformation of perpendicular-to-plane field components into in-plane components. The result is a higher accuracy.

Furthermore, also other possibilities to realize a vertical orientated AMR-layer are possible, like a plating processes of a groove having a width of the final AMR-layer.

In addition to the z-component sensitive sensor structure, also usual XMR-sensor structures can be used to set the x- and/or y-component in order to realize a fully three-dimensional sensor.

As already mentioned, by sweeping the position of the top and bottom contact 104 and 106 position, two types of vertical AMR-elements can be defined showing an inverted magnetoresistive characteristic. An adequate combination allows the realization of a differential Wheatstone bridge configuration as will become clear from the following description.

Figure 7A:
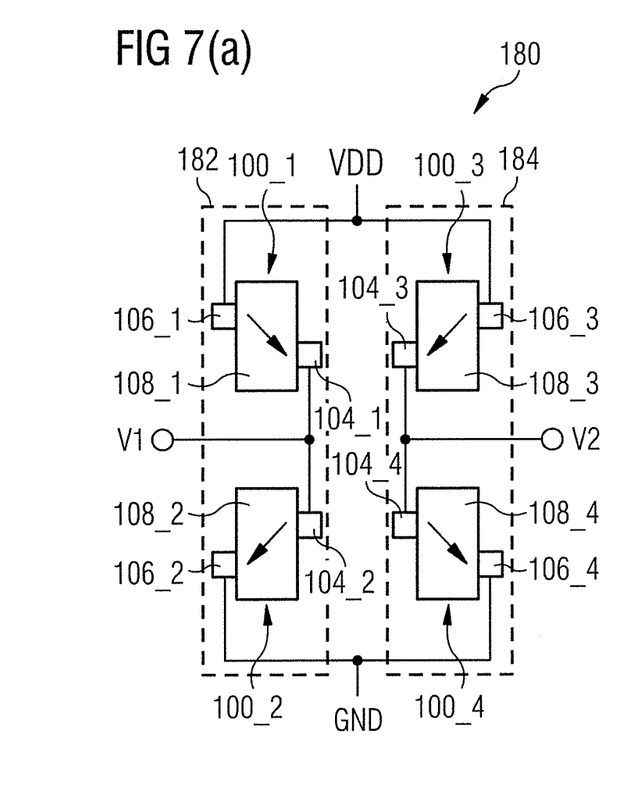
FIG. 7(a) shows a block diagram of a bridge circuit comprising four XMR-sensors.

FIG. 7(a) shows a block diagram of a bridge circuit 180. The bridge circuit 180 comprises a first bridge section 182 having a series connection of a first XMR-sensor 100_1 and a second XMR-sensor 100_2. Furthermore, the bridge circuit 180 comprises a second bridge section 184 having a series connection of a third XMR-sensor 100_3 and a fourth XMR-sensor 100_4.

The first XMR-sensor 100_1 comprises a substrate area, a first contact 104_1, a second contact 106_1 and an XMR-structure 108_1. The substrate area comprises a first main surface area and a second main surface area. The first contact 104_1 is arranged at the first main surface area. The second contact 106_1 is arranged at the second main surface area. The XMR-structure 108_1 extends from the first contact 104_1 to the second contact 106_1 such that an XMR-plane of the XMR-structure 108_1 is arranged along a first direction perpendicular to the first main surface area and the second main surface area, and along a second direction perpendicular to the first direction.

The second XMR-sensor 100_2 comprises a substrate area, a first contact 104_2, a second contact 106_2 and an XMR-structure 108_2. The substrate area comprises a first main surface area and a second main surface area. The first contact 104_2 is arranged at the first main surface area. The second contact 106_2 is arranged at the second main surface area. The XMR-structure 108_2 extends from the first contact 104_2 to the second contact 106_2 such that an XMR-plane of the XMR-structure 108_2 is arranged along a first direction perpendicular to the first main surface area and the second main surface area, and along a second direction perpendicular to the first direction.

The third XMR-sensor 100_3 comprises a substrate area, a first contact 104_3, a second contact 106_3 and an XMR-structure 108_3. The substrate area comprises a first main surface area and a second main surface area. The first contact 104_3 is arranged at the first main surface area. The second contact 106_3 is arranged at the second main surface area. The XMR-structure 108_3 extends from the first contact 104_3 to the second contact 106_3 such that an XMR-plane of the XMR-structure 108_3 is arranged along a first direction perpendicular to the first main surface area and the second main surface area, and along a second direction perpendicular to the first direction.

The fourth XMR-sensor 100_4 comprises a substrate area, a first contact 104_4, a second contact 106_4 and an XMR-structure 108_4. The substrate area comprises a first main surface area and a second main surface area. The first contact 104_4 is arranged at the first main surface area. The second contact 106_4 is arranged at the second main surface area. The XMR-structure 108_4 extends from the first contact 104_4 to the second contact 106_4 such that an XMR-plane of the XMR-structure 108_4 is arranged along a first direction perpendicular to the first main surface area and the second main surface area, and along a second direction perpendicular to the first direction.

Note that the first directions along which the XMR-planes of the first, second, third and fourth XMR-sensors 100_1 to 100_4 extend may be parallel to each other such that the first, second, third and fourth XMR-sensors 100_1 to 100_4 are sensitive to magnetic field components along the first direction.

Moreover, the second directions along which the XMR-planes of the first, second, third and fourth XMR-sensors 100_1 to 100_4 extend may be, but do not have to be, parallel to each other.

For example, if it is assumed that the bridge circuit 180 is arranged relative to a Cartesian coordinate system having an x'-axis, a y'-axis, and a z'-axis perpendicular to each other, then the XMR-planes of the XMR-sensors 100_1 to 100_4 can be arranged such that the first directions along which the XMR-planes of the XMR-sensors 100_1 to 100_4 extend are parallel to the z'-axis, e.g., to achieve a sensitivity to magnetic field components along the z'-axis.

A sensitivity of the XMR-planes of the XMR-sensors 100_1 to 100_4 to magnetic field components along the x'-/y'-axis then depend on the orientations of the XMR-planes (or vertical planes) of the XMR-sensors 100_1 to 100_4 to the stationary x'-/y'-axis. Naturally, it is possible to build up the resistances (XMR-sensors) of the Wheatstone bridge such that the second directions along which the XMR-planes of the XMR-sensors 100_1 to 100_4 extend are parallel to each other (e.g., parallel to the x'-axis or y'-axis), or in other words, such that the XMR-planes of the XMR-sensors 100_1 to 100_4 are parallel to each other. However, it would also be possible to assemble any resistance of the Wheatstone bridge by means of a combination of mutually perpendicular XMR-planes (sensor planes), for example, to reduce a dependence on the direction of the fields in the x'-/y'-plane, e.g., to achieve a reduced difference in the sensor signal when a parasitic field along the x'- or y'-axis is present.

In some embodiments, the first, second, third and fourth XMR-sensors 100_1 to 100_4 can share the same substrate 102, i.e., the substrate areas of the first, second, third and fourth XMR-sensors 100_1 to 100_4 can be substrate areas of the same substrate 102. In that case, the first main surface areas of the XMR-sensors 100_1 to 100_4 can be areas of a first main surface 110 of the substrate 102, wherein the second main surface areas of the XMR-sensors 100_1 to 100_4 can be areas of a second main surface 112 of the substrate 102.

Naturally, it is also possible that each XMR-sensor of the XMR-sensors 104_1 to 104_4 comprises its own substrate or that at least two XMR-sensors of the XMR-sensors 104_1 to 104 share the same substrate, e.g., that the first and second XMR-sensors 100_1 and 100_2 share a substrate and that the third and fourth XMR-sensor 100_3 and 100_4 share a substrate.

Moreover, the first contacts 104_1 to 104_4 of the XMR-sensors 100_1 to 100_4 can be arranged at a first plane perpendicular to the first direction (e.g., the first main surface 110 of the substrate 102), wherein the second contacts 106_1 to 106_4 of the XMR-sensors 100_1 to 100_4 can be arranged at a second plane parallel to the first plane and perpendicular to the first direction (e.g., the second main surface 112 of the substrate 102).

The first XMR-sensor 100_1 and the second XMR-sensor 100_2 can be arranged such that a distance along the second direction between the first contact 104_1 of the first XMR-sensor 100_1 and the first contact 104_2 of the second XMR-sensor 100_2 is smaller (or greater in an alternative embodiment) than a distance along the second direction between the second contact 106_1 of the first XMR-sensor 100_1 and the second contact 106_2 of the second XMR-sensor 100_2. Moreover, the third XMR-sensor 100_3 and the fourth XMR-sensor 100_4 can be arranged such that a distance along the second direction between the first contact 104_3 of the third XMR-sensor 100_3 and the first contact 104_4 of the fourth XMR-sensor 100_4 is smaller (or greater in the alternative embodiment) than a distance along the second direction between the second contact 106_3 of the third XMR-sensor 100_3 and the second contact 106_4 of the fourth XMR-sensor 100_4.

The first XMR-sensor 100_1 and the second XMR-sensor 100_2 can be connected in series such that the first contact 104_1 of the first XMR-sensor 100_1 and the first contact 104_2 of the second XMR-sensor 100_2 are connected to each other. The third XMR-sensor 100_3 and the fourth XMR-sensor 100_4 can be connected in series such that the first contact 104_3 of the third XMR-sensor 100_3 and the first contact 104_4 of the fourth XMR-sensor 100_4 are connected to each other.

Figure 7B:
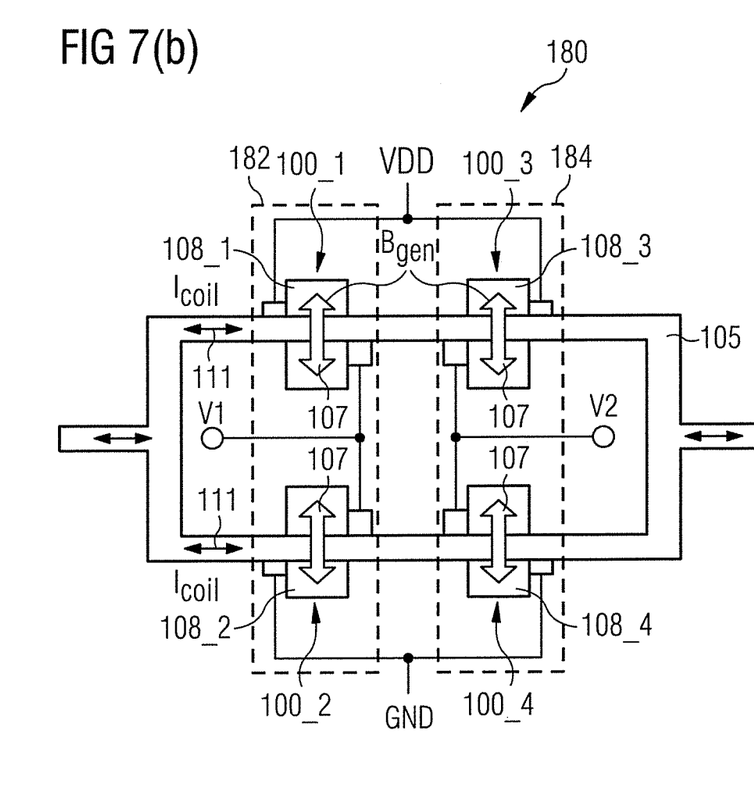
FIG. 7(b) shows a block diagram of the bridge circuit shown in FIG. 7(a), wherein each of the XMR-sensors comprises a current conductor.

FIG. 7(b) shows a block diagram of the bridge circuit 180 shown in FIG. 7(a), wherein each of the XMR-sensors 100_1 to 100_4 comprises a current conductor 105.

As described in detail with respect to FIGS. 4(b) and 4(c), the current conductor 105 can be arranged at or parallel to the first main surface area 110 or second main surface area 112 of the respective XMR-sensor 100_1 to 100_4 such that a current 111 flowing through the current conductor is perpendicular to the XMR-plane of the respective XMR-structure 108_1 to 108_4.

As already mentioned, in some embodiments, the first, second, third and fourth XMR-sensors 100_1 to 100_4 can share the same substrate 102, wherein the first main surface areas of the XMR-sensors 100_1 to 100_4 can be areas of a first main surface 110 of the substrate 102, wherein the second main surface areas of the XMR-sensors 100_1 to 100_4 can be areas of a second main surface 112 of the substrate 102. In that case, the current conductor 105 can be arranged at or parallel to the first main surface 110 or second main surface of the substrate 102.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An XMR-sensor, comprising:
a substrate having a first main surface area and a second, different main surface area;
an XMR-structure comprising at least one section that extends along a first direction perpendicular to the first main surface area or the second main surface area such that an XMR-plane of the XMR-structure is arranged in the first direction;
a first contact and a second contact arranged to contact the at least one section of the XMR-structure at different locations of the XMR-structure; and
a current conductor configured to conduct a current therethrough, and generate a magnetic field parallel to the XMR-plane of the XMR-structure in response to the conducting current,
wherein the substrate comprises at least two substrate layers stacked with respect to one another in the first direction, wherein the first contact is arranged in or at a first substrate layer of the at least two substrate layers, and wherein the second contact is arranged in or at a second substrate layer of the at least two substrate layers.

2. The XMR-sensor according to claim 1, wherein the first contact and the second contact are arranged to contact the at least one section of the XMR-structure at different locations along the first direction.

3. The XMR-sensor according to claim 1, wherein the first contact and the second contact are arranged to contact the at least one section of the XMR-structure directly or by means of a low impedance connection.

4. The XMR-sensor according to claim 1, wherein at least the first substrate layer and the second substrate layer of the at least two substrate layers comprise a dielectric material.

5. The XMR-sensor according to claim 1, wherein the first contact and the second contact are arranged at different positions of the XMR-structure along a second direction perpendicular to the first direction.

6. The XMR-sensor according to claim 1, wherein a dimension of the substrate along the first direction is smaller than a dimension of the substrate along a second direction perpendicular to the first direction.

7. The XMR-sensor according to claim 1, wherein the first main surface area and the second main surface area of the substrate are parallel to each other and face each other.

8. The XMR-sensor according to claim 1, wherein the XMR-structure extends from the first contact to the second contact such that the XMR-plane of the XMR-structure is arranged along the first direction and a second direction perpendicular to the first direction.

9. The XMR-sensor according to claim 1, wherein the XMR-structure extends from the first contact to the second contact such that a first edge of the XMR-structure is arranged along the first direction and a second edge of the XMR-structure is arranged along a second direction perpendicular to the first direction.

10. The XMR-sensor according to claim 1, wherein the XMR-structure is an AMR-structure, a GMR-structure, a TMR-structure, a CMR-structure or an EMR-structure.

11. The XMR-sensor according to claim 1, wherein the current conductor is arranged at or parallel to the second main surface area or the first main surface area.

12. A bridge circuit comprising a first bridge section having a series connection of a first XMR-sensor and a second XMR-sensor, and a second bridge section having a series connection of a third XMR-sensor and fourth XMR-sensor, wherein each of the first, second, third and fourth XMR-sensors comprises:
a substrate area having a first main surface area and a second, different main surface area;
an XMR-structure comprising at least one section that extends along a first direction perpendicular to the first main surface area and the second main surface area, such that an XMR-plane of the XMR-structure is arranged in the first direction and in a second direction perpendicular to the first direction;
a first contact and a second contact arranged to contact the at least one section of the XMR-structure at different locations of the XMR-structure; and
a current conductor configured to conduct a current therethrough, and generate a magnetic field parallel to the XMR-plane of the XMR-structure in response to the conducting current,
wherein the substrate comprises at least two substrate layers stacked with respect to one another in the first direction, wherein the first contact is arranged in or at a first substrate layer of the at least two substrate layers, and wherein the second contact is arranged in or at a second substrate layer of the at least two substrate layers.

13. The bridge circuit according to claim 12, wherein the XMR-planes of the XMR-structures of the first, second, third and fourth XMR-sensors are parallel to each other.

14. The bridge circuit according to claim 12, wherein the first contact and the second contact of each of the first, second, third and fourth XMR-sensors are arranged at different positions along the second direction of the XMR-structure;
wherein the first XMR-sensor and the second XMR-sensor are arranged such that a distance along the second direction between the first contact of the first XMR-sensor and the first contact of the second XMR-sensor is smaller than a distance along the second direction between the second contact of the first XMR-sensor and the second contact of the second XMR-sensor; and
wherein the third XMR-sensor and the fourth XMR-sensor are arranged such that a distance along the second direction between the first contact of the third XMR-sensor and the first contact of the fourth XMR-sensor is smaller or greater than a distance along the second direction between the second contact of the third XMR-sensor and the second contact of the fourth XMR-sensor.

15. The bridge circuit according to claim 14, wherein the first XMR-sensor and the second XMR-sensor are connected in series such that the first contact of the first XMR-sensor and the first contact of the second XMR-sensor are connected to each other; and
wherein the third XMR-sensor and the fourth XMR-sensor are connected in series such that the first contact of the third XMR-sensor and the first contact of the fourth XMR-sensor are connected to each other.

16. The bridge circuit according to claim 12, wherein the substrate areas of the first, second, third and fourth XMR-sensors are arranged on a common substrate.

17. A method for manufacturing an XMR-sensor, the method comprising:
providing a substrate having a first main surface area and a second, different main surface area;
providing an XMR-structure comprising at least one section that extends along a first direction perpendicular to the first main surface area or the second main surface area such that an XMR-plane of the XMR-structure is arranged in the first direction;
providing a first contact and a second contact arranged to contact the at least one section of the XMR-structure at different locations of the XMR-structure;
wherein providing the substrate comprises providing a first substrate layer and providing a second substrate layer;
wherein the first contact is arranged in the first substrate layer;
wherein providing the XMR-structure comprises etching the substrate from the second main surface area against the first direction at least until reaching the first contact in order to obtain an etched structure in which the first contact is at least partly exposed;
wherein the etched structure comprises side walls and a bottom wall;
wherein the etched structure is arranged such that one of the sidewalls of the etched structure extends from the second main surface area to the first contact;
wherein providing the XMR-structure comprises depositing an XMR-film on the second main surface area and on the etched structure such that the XMR-film rests on the etched structure covering the side walls and the bottom wall of the etched structure such that one part of the XMR-film, which rests on the one side wall of the etched structure that extends from the second main surface area to the first contact, extends from the second main surface area to the first contact; and
wherein the XMR-film is thinner than the second substrate layer.

18. The method according to claim 17, wherein providing the XMR-structure comprises:
applying a lithographic mask on a portion of the etched structure such that the lithographic mask rests on a portion of the XMR-film, the portion of the XMR-film including the part of the XMR-film along the first wall that extends from the second main surface area to the first contact; and
etching the XMR-film while maintaining the portion of the XMR-layer on which the lithographic mask rests.

19. The method according to claim 17, wherein providing the XMR-structure comprises depositing a dielectric layer on the XMR-film.

20. The method according to claim 19, wherein providing the XMR-structure comprises chemical mechanical polishing beginning from a surface of the dielectric layer until at least the second main surface area of the substrate and the part of the XMR-film that extends from the second main surface area to the first contact is exposed, wherein the XMR-film comprises a ferromagnetic material.

21. The method according to claim 20, wherein the second contact is provided at the second main surface area and contacts the exposed ferromagnetic layer such that the part of the XMR-film that extends from the second main surface area to the first contact forms the XMR-structure.

22. The method according to claim 17, wherein the step of providing the XMR structure comprises etching the XMR-layer at the bottom of the etched structure while maintaining the part of the XMR-layer which extends from the second main surface area to the first contact.

* * * * *